United States Patent [19]

Smith

[11] 4,256,828
[45] Mar. 17, 1981

[54] PHOTOCOPOLYMERIZABLE COMPOSITIONS BASED ON EPOXY AND HYDROXYL-CONTAINING ORGANIC MATERIALS

[75] Inventor: George H. Smith, Maplewood, Minn.

[73] Assignee: Minnesota Mining and Manufacturing Company, St. Paul, Minn.

[21] Appl. No.: 609,898

[22] Filed: Sep. 2, 1975

[51] Int. Cl.³ .................................................. G03C 1/68
[52] U.S. Cl. ........................... 430/280; 204/159.18; 204/159.23; 430/270; 430/914; 430/921; 430/925
[58] Field of Search ........................ 96/115 R, 115 P; 204/159.18, 159.23; 430/280, 270, 914, 921, 925

[56] References Cited

U.S. PATENT DOCUMENTS

| | | | |
|---|---|---|---|
| 2,935,488 | 5/1960 | Phillips et al. | 525/524 |
| 3,567,453 | 3/1971 | Borden | 96/91 |
| 3,711,390 | 1/1973 | Feinberg | 204/159.11 |
| 3,729,313 | 4/1973 | Smith | 96/27 R |
| 3,816,280 | 6/1974 | Watt | 96/115 P |
| 3,816,281 | 6/1974 | Feinberg | 204/159.11 |
| 3,826,650 | 7/1974 | Schlesinger | 96/35.1 |
| 4,026,705 | 5/1977 | Crivello et al. | 204/159.23 |
| 4,058,401 | 11/1977 | Crivello | 204/159.23 |
| 4,108,747 | 8/1978 | Crivello | 204/159.18 |
| 4,175,972 | 11/1979 | Crivello | 204/159.18 |
| 4,175,973 | 11/1979 | Crivello | 204/159.18 |

OTHER PUBLICATIONS

Irving et al., J. Chem. Soc. (1960) pp. 2078-2081.
Kennedy, Cationic Polymerization of Olefins, pp. 29-30.

*Primary Examiner*—Jack P. Brammer
*Attorney, Agent, or Firm*—C. Alexander; D. M. Sell; D. P. Edmundson

[57] ABSTRACT

Photocopolymerizable compositions are described which contain epoxides, organic material with hydroxyl functionality, and a photosensitive aromatic sulfonium or iodonium salt of a halogen-containing complex ion. Coated substrates are also described.

18 Claims, No Drawings

PHOTOCOPOLYMERIZABLE COMPOSITIONS BASED ON EPOXY AND HYDROXYL-CONTAINING ORGANIC MATERIALS

BACKGROUND OF THE INVENTION

1. Field of the Invention

This invention relates to photopolymerizable compositions. More particularly, this invention relates to compositions which comprise an organic material having epoxide functionality and another organic material having hydroxyl functionality. The compositions further contain an aromatic sulfonium or iodonium complex salt as photoinitiator and can be cured by exposure to actinic radiation or electron beam irradiation.

2. Description of the Prior Art

Although photopolymerizable epoxy compositions comprising epoxy resin materials and photosensitizers have been desired for some time, those which have previously been proposed suffer from one or more drawbacks. Thus, in U.S. Pat. No. 3,074,869 there are disclosed photosensitive epoxy compositions containing a nitrosoamine as photosensitizer. Compositions of this type require relatively long exposure to a high intensity light source to produce complete polymerization.

In U.S. Pat. Nos. 3,205,157 and 3,708,296 there are disclosed photosensitive epoxy compositions containing respectively aryldiazonium salts and aryldiazonium salts of halogen-containing complex anions. Such compositions have limited usefulness because they have poor thermal stability, and because nitrogen is evolved during photopolymerization causing pinholes and bubbles in coatings of the composition.

When these known aryldiazonium salts are used to induce polymerization of oxetanes, or mixtures of oxetanes with epoxy resins, e.g., as described in U.S. Pat. No. 3,835,003, the same types of problems are encountered. Although several patents describe various techniques for stabilizing mixtures of diazonium salts and epoxides, such techniques are not satisfactory for several reasons. For example, the increase in stability which is obtained is measured only in days. Also, the addition of stabilizers contaminates the compositions with non-reactive material which softens the resulting products and also reduces the rate of photocure. See, e.g., U.S. Pat. Nos. 3,711,390; 3,711,931; 3,816,278; 3,816,280; 3,816,281; 3,817,850 and 3,817,845.

In U.S. Pat. No. 3,450,613 there is described another photopolymerizable epoxy composition comprising the reaction product of an epoxy resin prepolymer and an ethylenically unsaturated organic acid, a photosensitizer, and optionally polyfunctional acids or bases. This composition on exposure to ultraviolet light gels by reason of the photoinduced polymerization of the ethylenically unsaturated portion of the reaction product. Completion of the cure of the composition is effected by heating to bring about reaction of the epoxy resin portion of the composition. Such compositions have limited usefulness because of the requirement of both light and heat to effect complete polymerization of the composition. The composition furthermore is oxygen sensitive and has poor thermal stability.

There is also a need for a thermally stable, one-part, photocurable epoxy composition which provides a flexible coating. Such has not heretofore been provided.

The present invention provides novel photopolymerizable compositions comprising organic material having epoxide functionality, another organic material having hydroxyl functionality, and a complex salt photoinitiator. The compositions may be photocured by exposure to light or by exposure to electron beam irradiation.

Although reaction between epoxides and aliphatic hydroxyl groups has been known, such reaction has been carried out at elevated temperatures by heating the reactants in the presence of basic or acid catalysts. For example, U.S. Pat. Nos. 2,731,444; 2,830,031; 2,914,490; and 3,826,669 describe the thermal reactions of a variety of epoxides with different types of polyols including copolymers containing reactive hydroxyl groups. Although such reactions proceed very slowly in the presence of a catalyst at room temperature, elevated temperatures (e.g., 125–250° C.) are required in order to get reasonable reaction rates and useful properties. Further, those mixtures described, in the patents, which contained acid catalysts were not stable at room temperature.

SUMMARY OF THE INVENTION

In accordance with the present invention there are provided photocopolymerizable compositions which are readily photocured by exposure to actinic radiation or electron beam irradiation. The compositions comprise:

(a) a first organic material having epoxide functionality greater than about 1.5;

(b) a second organic material having hydroxyl functionality of at least 1; and (c) a complex salt photoinitiator selected from the group consisting of aromatic iodonium complex salts and aromatic sulfonium complex salts. Optionally, and preferably, the compositions contain a sensitizer for the photoinitiator.

The photocopolymerizable compositions of the invention overcome the disadvantages of previously known compositions. For example, the compositions of the invention are one-part, stable compositions having excellent shelf life, and are photocurable even at room temperature or below. When the number of equivalents of epoxide in the composition is in excess of the equivalents of hydroxyl-containing material, the cured compositions possess excellent toughness; abrasion resistance; adhesion to metal, glass, plastic, wood and other surfaces; and resistance to chemical attack. When the epoxide constitutes a relatively small weight fraction of the composition, and the hydroxyl-containing material is polyfunctional, the characteristics of the resulting cured composition depend primarily on the characteristics of the hydroxyl-containing material. Also, liquid hydroxyl-containing organic materials may be combined with liquid epoxides to provide solventless coatings of low viscosity and excellent thermal stability; yet, the compositions can be photocured rapidly, without release of volatiles, to provide tough, flexible coatings without loss of other desirable properties. Furthermore, when using the solventless liquid compositions the problems and disadvantages associated with solvent coating are obviated and energy-consumption and pollution are minimized. The compositions of the invention can be used in a variety of applications, e.g., as photocurable ink vehicles, binders for abrasive particles, paints, adhesives, coatings for lithographic and relief printing plates, protective coatings for metals, wood, etc.

By selection of suitable hydroxyl-containing organic material as a co-monomer for the epoxide, one may readily obtain a storage-stable, one-part photocurable composition which is readily cured by exposure to light or electron beam to provide a cured composition having the desired physical properties.

DETAILED DESCRIPTION OF THE INVENTION

Epoxy-containing materials useful in the compositions of the invention are any organic compounds having an oxirane ring (i.e.,

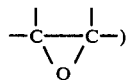

polymerizable by ring opening. Such materials, broadly called epoxides, include monomeric epoxy compounds and epoxides of the polymeric type and can be aliphatic, cycloaliphatic, aromatic or heterocyclic. These materials generally have, on the average, at least 1.5 polymerizable epoxy groups per molecule (preferably two or more epoxy groups per molecule). The polymeric epoxides include linear polymers having terminal epoxy groups (e.g., a diglycidyl ether of a polyoxyalkylene glycol), polymers having skeletal oxirane units (e.g., polybutadiene polyepoxide), and polymers having pendent epoxy groups (e.g., a glycidyl methacrylate polymer or copolymer). The epoxides may be pure compounds but are generally mixtures containing one, two, or more epoxy groups per molecule. The "average" number of epoxy groups per molecule is determined by dividing the total number of epoxy groups in the epoxy-containing material by the total number of epoxy molecules present.

These epoxy-containing materials may vary from low molecular weight monomeric materials to high molecular weight polymers and may vary greatly in the nature of their backbone and substituent groups. For example, the backbone may be of any type and substituent groups thereon can be any group free of an active hydrogen atom which is reactive with an oxirane ring at room temperature. Illustrative of permissible substituent groups include halogens, ester groups, ethers, sulfonate groups, siloxane groups, nitro groups, phosphate groups, etc. The molecular weight of the epoxy-containing materials may vary from 58 to about 100,000 or more. Mixtures of various epoxy-containing materials can also be used in the compositions of this invention.

Useful epoxy-containing materials include those which contain cyclohexene oxide groups such as the epoxycyclohexanecarboxylates, typified by 3,4-epoxycyclohexylmethyl-3,4-epoxycyclohexanecarboxylate, 3,4-epoxy-2-methylcyclohexylmethyl-3,4-epoxy-2-methylcyclohexane carboxylate, and bis(3,4-epoxy-6-methylcyclohexylmethyl) adipate. For a more detailed list of useful epoxides of this nature, reference is made to the U.S. Pat. No. 3,117,099, incorporated herein by reference.

Further epoxy-containing materials which are particularly useful in the practice of this invention include glycidyl ether monomers of the formula

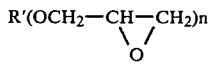

where R' is alkyl or aryl and n is an integer of 1 to 6. Examples are glycidyl ethers of polyhydric phenols obtained by reacting a polyhydric phenol with an excess of chlorohydrin such as epichlorohydrin (e.g., the diglycidyl ether of 2,2-bis-(2,3-epoxypropoxyphenol)-propane). Further examples of epoxides of this type which can be used in the practice of this invention are described in U.S. Pat. No. 3,018,262, incorporated herein by reference, and in "Handbook of Epoxy Resins" by Lee and Neville, McGraw-Hill Book Co., New York (1967).

There are a host of commercially available epoxy-containing materials which can be used in this invention. In particular, epoxides which are readily available include octadecylene oxide, epichlorohydrin, styrene oxide, vinyl cyclohexene oxide, glycidol, glycidylmethacrylate, diglycidyl ether of Bisphenol A (e.g., those available under the trade designations "Epon 828", "Epon 1004" and "Epon 1010" from Shell Chemical Co., "DER-331", "DER-332", and "DER-334", from Dow Chemical Co.), vinylcyclohexene dioxide (e.g., "ERL-4206" from Union Carbide Corp.), 3,4-epoxycyclohexylmethyl-3,4-epoxycyclohexene carboxylate (e.g., "ERL-4221" from Union Carbide Corp.), 3,4-epoxy-6-methylcyclohexylmethyl-3,4-epoxy-6-methylcyclohexene carboxylate (e.g., "ERL-4201" from Union Carbide Corp.), bis(3,4-epoxy-6-methylcyclohexylmethyl) adipate (e.g., "ERL-4289" from Union Carbide Corp.), bis(2,3-epoxycyclopentyl) ether (e.g., "ERL-0400" from Union Carbide Corp.), aliphatic epoxy modified with polypropylene glycol (e.g., "ERL-4050" and "ERL-4052" from Union Carbide Corp.), dipentene dioxide (e.g., "ERL-4269" from Union Carbide Corp.), epoxidized polybutadiene (e.g., "Oxiron 2001" from FMC Corp.), silicone resin containing epoxy functionality, flame retardant epoxy resins (e.g., "DER-580", a brominated bisphenol type epoxy resin available from Dow Chemical Co.), 1,4-butanediol diglycidyl ether of phenolformaldehyde novolak (e.g., "DEN-431" and "DEN-438" from Dow Chemical Co.), and resorcinol diglycidyl ether(e.g., "Kopoxite" from Koppers Company, Inc.).

Still other epoxy-containing materials are copolymers of acrylic acid esters or glycidol such as glycidylacrylate and glycidylmethacrylate with one or more copolymerizable vinyl compounds. Examples of such copolymers are 1:1 styrene-glycidylmethacrylate, 1:1 methylmethacrylate-glycidylacrylate and a 62.5:24:13.5 methylmethacrylate-ethyl acrylate-glycidylmethacrylate.

Other useful epoxy-containing materials are well known and include such epoxides as epichlorohydrins, e.g., epichlorohydrin; alkylene oxides, e.g., propylene oxide, styrene oxide; alkenyl oxides, e.g., butadiene oxide; glycidyl esters, e.g., ethyl glycidate.

The hydroxyl-containing material which is used in the present invention may be any liquid or solid organic material having hydroxyl functionality of at least 1, and preferably at least 2. Also, the hydroxyl-containing organic material is free of other "active hydrogens". The term "active hydrogen" is well known and commonly used in the art, and as used herein it means active hydrogen as determined by the method described by Zerewitinoff in J. Am. Chem. Soc., Vol. 49, 3181 (1927), incorporated herein by reference. Of course, the hydroxyl-containing material is also substantially free of groups which may be thermally or photolytically unstable; that is, the material will not decompose or liberate volatile components at temperatures below about 100° C. or in the presence of actinic light or electron beam irradiation which may be encountered during the desired curing conditions for the photocopolymerizable composition.

Preferably the organic material contains two or more primary or secondary aliphatic hydroxyl groups (i.e., the hydroxyl group is bonded directly to a non-aromatic carbon atom). The hydroxyl group may be terminally situated, or they may be pendent from a polymer or copolymer. The molecular weight (i.e., number average molecular weight) of the hydroxyl-containing organic material may vary from very low (e.g., 62) to very high (e.g., one million or more). The equivalent weight (i.e., number average equivalent weight) of the hydroxyl-containing material is preferably in the range of about 31 to 5000. When materials of higher equivalent weight are used they tend to reduce the rate and extent of copolymerization.

Representative examples of suitable organic materials having a hydroxyl functionality of 1 include alkanols, monoalkyl ethers of polyoxyalkyleneglycols, monoalkyl ethers of alkylene-glycols, and others known to the art.

Representative examples of useful monomeric polyhydroxy organic materials include alkylene glycols (e.g., 1,2-ethanediol, 1,3-propanediol, 1,4-butanediol, 2-ethyl-1,6-hexanediol, bis(hydroxymethyl)cyclohexane, 1,18-dihydroxyoctadecane, 3-chloro-1,2-propanediol), polyhydroxyalkanes (e.g., glycerine, trimethylolethane, pentaerythritol, sorbitol) and other polyhydroxy compounds such as N,N-bis(hydroxyethyl)benzamide, 2-butyne-1,4-diol, 4,4'-bis(hydroxymethyl)diphenylsulfone, castor oil, etc.

Representative examples of useful polymeric hydroxy-containing materials include polyoxyethylene and polyoxypropylene glycols and triols of molecular weights from about 200 to about 10,000, corresponding to equivalent weight of 100 to 5000 for the diols or 70 to 3300 for triols; polytetramethylene glycols of varying molecular weight; copolymers of hydroxypropyl and hydroxyethyl acrylates and methacrylates with other free radical-polymerizable monomers such as acrylate esters, vinyl halides, or styrene; copolymers containing pendent hydroxy groups formed by hydrolysis or partial hydrolysis of vinyl acetate copolymers, polyvinylacetal resins containing pendent hydroxyl groups; modified cellulose polymers such as hydroxyethylated and hydroxypropylated cellulose; hydroxy-terminated polyesters and hydroxy-terminated polyactones; and hydroxy-terminated polyalkadienes.

Useful commercially available hydroxyl-containing materials include the "Polymeg" ® series (available from Quaker Oats Company) of polytetramethylene ether glycols such as "Polymeg" 650, 1000 and 2000; "PeP" (available from Wyandotte Chemicals Corporation) of polyoxyalkylene tetrols having secondary hydroxyl groups such as "PeP" 450, 550 and 650; "Butvar" series (available from Monsanto Chemical Company) of polyvinylacetal resins such as "Butvar" B-72A, B-73, B-76, B-90 and B-98; and "Formvar" 7/70, 12/85, 7/95S, 7/95E, 15/95S and 15/95 E; "PCP" series (available from Union Carbide) of polycaprolactone polyols such as "PCP" 0200, 0210, 0230, 0240, 0300; "Paraplex U-148" (available from Rohm and Haas), an aliphatic polyester diol; "Multron" R series (available from Mobay Chemical Co.) of saturated polyester polyols such as "Multron" R-2, R-12A, R-16, R-18, R-38, R-68 and R-74; "Klucel E" (available from Hercules Inc.) a hydroxypropylated cellulose having an equivalent weight of approximately 100; and "Alcohol Soluble Butyrate" (available from Eastman Kodak) a cellulose acetate butyrate ester having a hydroxyl equivalent weight of approximately 400.

The amount of hydroxyl-containing organic material used in the compositions of the invention may vary over broad ranges, depending upon factors such as the compatibility of the hydroxyl-containing material with the epoxide, the equivalent weight and functionality of the hydroxyl-containing material, the physical properties desired in the final cured composition, the desired speed of photocure, etc.

Generally speaking, with increasing amounts of hydroxyl-containing material in the composition the cured product exhibits improved impact resistance, adhesion to substrates, flexibility, and decreased shrinkage during curing, and correspondingly there is a gradual decrease in hardness, tensile strength and solvent-resistance.

Although both mono-functional and poly-functional hydroxyl-containing materials provide desirable results in the compositions of the invention, use of the poly-functional hydroxyl-containing materials is highly preferred for a majority of applications, although the mono-functional hydroxyl-containing materials are particularly effective in providing low viscosity, solvent-free coating compositions. When using hydroxyl-containing organic materials having a functionality significantly less than 2 (e.g., to 1 to 1.5), amounts greater than about 0.2 equivalent of hydroxyl per equivalent of epoxy tend to provide cured compositions which are generally low in internal strength and tensile strength and are susceptible to solvent attack, and consequently may be unsuitable for many applications. This tendency becomes increasingly more apparent with increasing equivalent weight of the hydroxyl-containing material. Accordingly, when using mono-functional hydroxy materials it is preferred that the equivalent weight thereof be no greater than about 250.

When poly-functional hydroxyl-containing material is used it may be used in any amount, depending upon the properties desired in the cured composition. For example, the ratio of equivalents of hydroxyl-containing material to equivalents of epoxide may vary from about 0.001/1 to 10/1. For applications where one primarily desires flexibilization of an epoxy resin (e.g., for protective coatings on metal) ratios as low as 0.001/1 provide improved results. For applications where the epoxide is present primarily as an insolubilizing agent for a polyhydroxy-containing film-forming thermoplastic organic material (e.g., coatings for printing plates), ratios of hydroxyl equivalents to epoxide equivalents may be as high as 10/1. Generally speaking, the higher the hydroxyl equivalent weight the more effective such material is in imparting a given degree of toughness and flexibility to the cured composition.

Mixtures of hydroxyl-containing materials may be used, when deirsed. For example, one may use mixtures of two or more poly-functional hydroxy materials, one or more mono-functional hydroxy materials with poly-functional hydroxy materials, etc.

The photoinitiators which are useful in the compositions of the invention are of two types, viz. aromatic iodonium complex salts and aromatic sulfonium complex salts. The aromatic iodonium complex salts are of the formula:

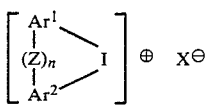

where $Ar^1$ and $Ar^2$ are aromatic groups having 4 to 20 carbon atoms and are selected from the group consisting of phenyl, thienyl, furanyl and pyrazolyl groups; Z is selected from the group consisting of oxygen; sulfur;

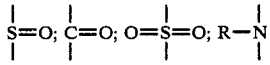

where R is aryl (of 6 to 20 carbons, such as phenyl) or acyl (of 2 to 20 carbons, such as acetyl, benzoyl, etc.); a carbon-to-carbon bond; or

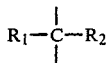

where $R_1$ and $R_2$ are selected from hydrogen, alkyl radicals of 1 to 4 carbons, and alkenyl radicals of 2 to 4 carbons; and n is zero or 1; and wherein $X^-$ is a halogen-containing complex anion selected from tetrafluoroborate, hexafluorophosphate, hexafluoroarsenate,, and hexafluoroantimonate.

The aromatic iodonium cations are stable and are well known and recognized in the art. See for example, U.S. Pat. Nos. 3,565,906; 3,712,920; 3,759,989; and 3,763,187; F. Beringer, et al., Diaryliodonium Salts IX, J. Am. Chem. Soc. 81, 342-51 (1959) and F. Beringer, et al., Diaryliodonium Salts XXIII, J. Chem. Soc. 1964, 442-51; F. Beringer, et al., Iodonium Salts Containing Heterocyclic Iodine, J. Org. Chem. 30, 1141-8 (1965).

Representative $Ar^1$ and $Ar^2$ groups are aromatic groups having 4 to 20 carbon atoms selected from phenyl, thienyl, furanyl, and pyrazolyl groups. These aromatic groups may optionally have one or more fused benzo rings (e.g., naphthyl and the like; benzothienyl, dibenzothienyl; benzofuranyl, dibenzofuranyl; etc.). Such aromatic groups may also be substituted, if desired, by one or more of the following non-basic groups which are essentially non-reactive with epoxide and hydroxy: halogen, nitro, N-arylanilino groups, ester groups (e.g., alkoxycarbonyl such as methoxycarbonyl and ethoxycarbonyl, phenoxycarbonyl), sulfo ester groups (e.g., alkoxysulfonyl such as methoxysulfonyl and butoxysulfonyl, phenoxysulfonyl, and the like), amido groups (e.g., acetamido, butyramido, ethylsulfonamido, and the like), carbamyl groups (e.g., carbamyl, N-alkylcarbamyl, N-phenylcarbamyl, and the like), sulfamyl groups (e.g., sulfamyl, N-alkylsulamyl, N,N-dialkylsulfamyl, N-phenylsulfamyl, and the like), alkoxy groups (e.g., methoxy, ethoxy, butoxy, and the like), aryl groups (e.g., phenyl), alkyl groups (e.g., methyl, ethyl, butyl, and the like), aryloxy groups (e.g., phenoxy) alkylsulfonyl (e.g., methylsulfonyl, ethylsulfonyl, and the like), arylsulfonyl groups (e.g., phenylsulfonyl groups), perfluoroalkyl groups (e.g., trifluoromethyl, perfluoroethyl, and the like), and perfluoroalkylsulfonyl groups (e.g., trifluoromethylsulfonyl, perfluorobutylsulfonyl, and the like).

Suitable examples of the aromatic iodonium complex salt photoinitiators include:
diphenyliodonium tetrafluoroborate
di(4-methylphenyl)iodonium tetrafluoroborate
phenyl-4-methylphenyliodonium tetrafluoroborate
di(4-heptylphenyl)iodonium tetrafluoroborate
di(3-nitrophenyl)iodonium hexafluorophosphate
di(4-chlorophenyl)iodonium hexafluorophosphate
di(naphthyl)iodonium tetrafluoroborate
di(4-trifluoromethylphenyl)iodonium tetrafluoroborate
diphenyliodonium hexafluorophosphate
di(4-methylphenyl)iodonium hexafluorophosphate
diphenyliodonium hexafluoroarsenate
di(4-phenoxyphenyl)iodonium tetrafluoroborate
phenyl-2-thienyliodonium hexafluorophosphate
3,5-dimethylpyrazolyl-4-phenyliodonium hexafluorophosphate
diphenyliodonium hexafluoroantimonate
2,2'-diphenyliodonium tetrafluoroborate di(2,4-dichlorophenyl)iodonium hexafluorophosphate
di(4-bromophenyl)iodonium hexafluorophosphate
di(4-methoxyphenyl)iodonium hexafluorophosphate
di(3-carboxyphenyl)iodonium hexafluorophosphate
di(3-methoxycarbonylphenyl)iodonium hexafluorophosphate
di(3-methoxysulfonylphenyl)iodonium hexafluorophosphate
di(4-acetamidophenyl)iodonium hexafluorophosphate
di(2-benzothienyl)iodonium hexafluorophosphate Of the aromatic iodonium complex salts which are suitable for use in the compositions of the invention the preferred salts are the diaryliodonium hexafluorophosphate and the diaryliodonium hexafluoroantimonate. These salts are preferred because, in general, they are more thermally stable, promote faster reaction, and are more soluble in inert organic solvents than are other aromatic iodonium salts of complex ions.

The aromatic iodonium complex salts may be prepared by metathesis of corresponding aromatic iodonium simple salts (such as, for example, the diphenyliodonium bisulfate) in accordance with the teachings of Beringer, et al., J. Am. Chem. Soc. 81, 342 (1959). Thus, for examples, the complex salt diphenyliodonium tetrafluoroborate is prepared by the addition of 60° C. of an aqueous solution containing 29.2 g. (150 millimoles) silver fluoroborate, 2 g. fluoroboric acid, and 0.5 g. phosphorous acid in about 30 ml. of water to a solution of 44 g. (139 millimoles) of diphenyliodonium chloride. The silver halide that precipitates is filtered off and the filtrate concentrated to yield diphenyliodonium fluoroborate which may be purified by recrystallization.

The aromatic iodonium simple salts may be prepared in accordance with Beringer et al., above, by various methods including (1) coupling of two aromatic compounds with iodyl sulfate in sulfuric acid, (2) coupling of two aromatic compounds with an iodate in acetic acid-acetic anhydride-sulfuric acid, (3) coupling of two aromatic compounds with an iodine acylate in the presence of an acid, and (4) condensation of an iodoso compound, an iodoso diacetate, or an iodoxy compound with another aromatic compound in the presence of an acid. Diphenyliodonium bisulfate is prepared by method (3), for example, by the addition over a period of eight hours at below 5° C. of a mixture of 35 ml. of conc. sulfuric acid and 50 ml. of acetic anhydride to a well-stirred mixture of 55.5 ml. of benzene, 50 ml. of acetic anhydride, and 53.5 g. of potassium iodate. The mixture is stirred for an additional four hours at 0°-5° C. and at room temperature for 48 hours and treated with 300 ml. of diethyl ether. On concentration, crude diphenyliodonium bisulfate precipitates. If desired, it may be purified by recrystallization.

The aromatic sulfonium complex salt photoinitiators suitable for use in the compositions of the invention can be defined by the formula

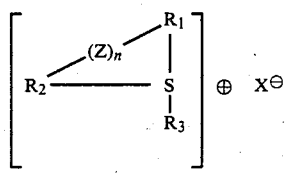

wherein $R_1$, $R_2$, and $R_3$ can be the same or different, provided that at least one of such groups is aromatic, and such groups can be selected from aromatic groups having 4 to 20 carbon atoms (e.g., substituted and unsubstituted phenyl, thienyl, and furanyl) and alkyl radicals having 1 to 20 carbon atoms. The term "alkyl" as used here is meant to include substituted alkyl radicals (for example, substituents such as halogen, hydroxy, alkoxy, aryl). Preferably, $R_1$, $R_2$ and $R_3$ are each aromatic. Z is selected from the group consisting of oxygen; sulfur;

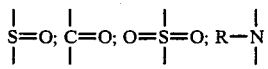

where R is aryl (of 6 to 20 carbons, such as phenyl) or acyl (of 2 to 20 carbons, such as acetyl, benzoyl, etc.); a carbon-to-carbon bond; or

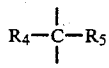

where $R_4$ and $R_5$ are selected from the group consisting of hydrogen, an alkyl radical having 1 to 4 carbon atoms, and an alkenyl radical having 2 to 4 carbon atoms; and n is zero or 1; and $X^-$ is a halogen-containing complex anion selected from the group consisting of tetrafluoroborate, hexafluorophosphate, hexafluoroarsenate, and hexafluoroantimonate.

Aromatic sulfonium salts are known and recognized in the art. Triaryl-substituted sulfonium compounds, for example, can be prepared by the procedures described in G. H. Wiegand, et al., Synthesis and Reactions of Triarylsulfonium Halides, J. Org. Chem. 33, 2671–75 (1968). Aromatic sulfonium salts also having alkyl-substitution can be prepared by the procedures described in K. Ohkubo et al., J. Org. Chem. 36, 3149–55 (1971). The preferred method for making triaryl-substituted sulfonium compounds is described in U.S. Pat. No. 2,807,648, incorporated herein by reference, from which the complex sulfonium salts can be made. The complex sulfonium salts can be prepared from the corresponding simple salts, such as the halide salts, by metathesis with a metal or ammonium salt of the complex anion desired.

The sulfonium complex salts are substituted with at least one, and preferably three, aromatic groups. Represenative groups are aromatic groups having 4 to 20 carbon atoms and are selected from phenyl, thienyl and furanyl groups. These aromatic groups may optionally have one or more fused benzo rings (e.g., naphthyl and the like; benzothienyl, dibenzothienyl; benzofuranyl, dibenzofuranyl; etc.). Such aromatic groups may also be substituted, if desired, by one or more of the following non-basic groups which are essentially non-reactive with epoxide and hydroxy; halogen, nitro, aryl, ester groups (e.g., alkoxycarbonyl such as methoxycarbonyl and ethoxycarbonyl, phenoxycarbonyl and acyloxy such as acetoxy and propionyloxy), sulfo ester groups (e.g., alkoxysulfonyl such as methoxysulfonyl and butoxysulfonyl, phenoxysulfonyl, and the like), amido groups (e.g., acetamido, butyramido, ethylsulfonamido, and the like), carbamyl groups (e.g., carbamyl, N-alkylcarbamyl, N-phenylcarbamyl, and the like), sulfamyl groups (e.g., sulfamyl, N-alkylsulfamyl, N,N-dialkylsulfamyl, N-phenylsulfamyl, and the like), alkoxy groups (e.g., methoxy, ethoxy, butoxy, and the like), aryl groups (e.g., phenyl) alkyl groups (e.g., methyl, ethyl, butyl, and the like) aryloxy groups (e.g., phenoxy), alkylsulfonyl (e.g., methylsulfonyl, ethylsulfonyl, and the like), arylsulfonyl groups (e.g., phenylsulfonyl groups), perfluoroalkyl groups (e.g., trifluoromethyl, perfluoroethyl, and the like), and perfluoroalkylsulfonyl groups (e.g., trifluoromethylsulfonyl, perfluorobutylsulfonyl, and the like).

Examples of suitable aromatic sulfonium complex salt photoinitiators include:
triphenylsulfonium tetrafluoroborate
methyldiphenylsulfonium tetrafluoroborate
dimethylphenylsulfonium hexafluorophosphate
triphenylsulfonium hexafluorophosphate
triphenylsulfonium hexafluoroantimonate
diphenylnaphthylsulfonium hexafluoroarsenate
tritolysulfonium hexafluorophosphate
anisyldiphenylsulfonium hexafluoroantimonate
4-butoxyphenyldiphenylsulfonium tetrafluoroborate
4-chlorophenyldiphenylsulfonium hexafluoroantimonate
tris(4-phenoxyphenyl)sulfonium hexafluorophosphate
di(4-ethoxyphenyl)methylsulfonium hexafluoroarsenate
4-acetoxy-phenyldiphenylsulfonium tetrafluoroborate
tris(4-thiomethoxyphenyl)sulfonium hexafluorophosphate
di(methoxysulfonylphenyl)methylsulfonium hexafluoroantimonate
di(methoxynaphthyl)methylsulfonium tetrafluoroborate
di(carbomethoxyphenyl)methylsulfonium hexafluorophosphate
4-acetamidophenyldiphenylsulfonium tetrafluoroborate
dimethylnaphthylsulfonium hexafluorophosphate
trifluoromethyldiphenylsulfonium tetrafluoroborate
methyl(N-methylphenothiazinyl)sulfonium hexafluoroantimonate
phenylmethylbenzylsulfonium hexafluorophosphate

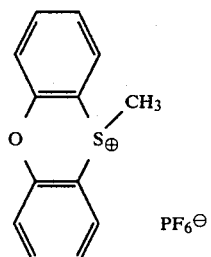

(10-methylphenoxathiinium hexafluorophosphate)

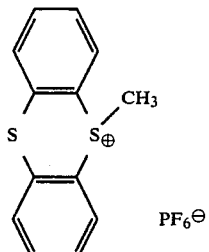

(5-methylthianthrenium hexafluorophosphate)

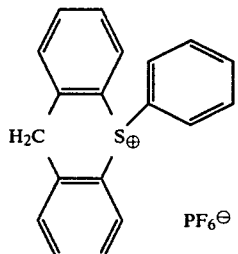

(10-phenylthioxanthenium hexafluorophosphate)

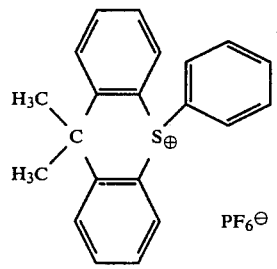

(10-phenyl-9,9-dimethylthioxanthenium hexafluorophosphate)

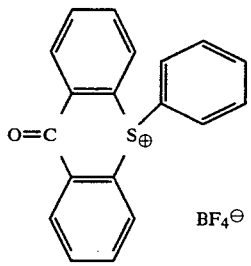

(10-phenyl-9-oxothioxanthenium tetrafluoroborate)

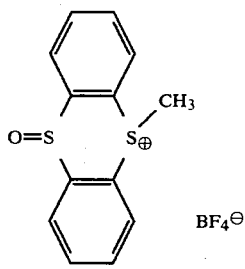

(5-methyl-10-oxothianthrenium tetrafluoroborate)

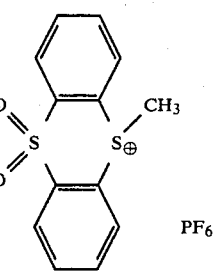

(5-methyl-10,10-dioxothianthrenium hexafluorophosphate)

Of the aromatic sulfonium complex salts which are suitable for use in the compositions of the invention the preferred salts are the triaryl-substituted salts such as triphenylsulfonium hexalfuorophosphate. The triaryl-substituted salts are preferred because they are more thermally stable than the mono- and diaryl substituted salts thereby providing a one-part curable system with long shelf life. Also, the rate of photocuring at a given light exposure is greater when triaryl-substituted complex salts are used. The triaryl-substituted complex salts are also more amenable to dye sensitization. Consequently, the use of such complex salts results in photopolymerizable compositions which are much more useful in graphic arts applications and in other applications where near ultraviolet and visible light are used for exposure.

The photocopolymerizable compositions of the invention can be used as adhesives, caulking and sealing compounds, casting and molding compounds, potting and encapsulating compounds, impregnating and coating compounds, etc., depending on the particular organic material and aromatic sulfonium complex salt used. The photocopolymerizable composition can be used as a one-part cured-in-place composition.

If desired, one may include in the photocopolymerizable compositions various conventional non-basic fillers (e.g., silica, talc, glass bubbles, clays, powdered metal such as aluminum, zinc oxide, etc.) up to about 50% by volume or more, viscosity modifiers, rubbers, tackifying agents, pigments, and so forth.

The photocopolymerizable compositions are particularly suitable in a variety of applications in the fields of protective coatings and graphic arts due to their superior impact resistance and abrasion-resistance and adhesion to rigid, resilient and flexible substrates such as metal, plastic, rubber, glass, paper, wood, and ceramics; their excellent resistance to most solvents and chemicals; and their capability of forming high resolution images. Among such uses are in making acid- and alkali-resist images for chemical milling, gravure images, offset plates, flexographic printing, screenless lithography, relief printing plates, stencil making, microimages for printed circuitry, microimages for information storage, decorations of paper, glass, and metal surfaces, and light-cured protective coatings. The compositions may also be used to impregnate substrates such as glass cloth and the like to obtain a shelf stable product which is useful in many manufacturing and repairing processes where a thermally curable liquid composition is not convenient to use.

The photopolymerization of the compositions of the invention occurs on exposure of the compositions to any source of radiation emitting actinic radiation at a wavelength within the ultraviolet and visible spectral regions. Suitable sources of radiation include mercury, xenon, carbon arc and tungsten filament lamps, sunlight, etc. Exposures may be from less than about 1 second to 10 minutes or more depending upon the amounts of particular polymerizable materials and aromatic complex salts being utilized and depending upon the radiation source and distance from the source and the thickness of the coating to be cured. The compositions may also be polymerized by exposure to electron beam irradiation. Generally speaking the dosage necessary is from less than 1 megarad to 100 megarad or more. One of the major advantages of electron beam curing is that highly pigmented compositions can be effectively cured at a faster rate than by exposure to actinic radiation.

The curing is a triggered reaction, i.e., once the degradation of the aromatic iodonium or sulfonium complex salt has been initiated by exposure to a radiation source, the curing reaction proceeds and will continue after the radiation source is removed. The use of thermal energy during or after exposure to a radiation source will generally accelerate the curing reaction, and even a moderate increase in temperature may greatly accelerate cure rate.

The aromatic iodonium complex salts useful in the photopolymerizable compositions of the invention are of themselves photosensitive only in the ultraviolet. They, however, can be sensitized to the near ultraviolet and the visible range of the spectrum by sensitizers for known photolyzable organic halogen compounds in accordance with the teachings of U.S. Pat. No. 3,729,313 which is incorporated herein by reference. Illustrative sensitizers are found in the following categories: aromatic amines and colored aromatic polycyclic hydrocarbons. The use of strongly basic amino compounds is less desirable, since such compounds tend to slow the polymerization.

The aromatic sulfonium complex salts useful in the photopolymerizable compositions of the invention are of themselves photosensitive only in the ultraviolet. They, however, are sensitized to the near ultraviolet and the visible range of the spectrum by a select group of sensitizers. Useful sensitizers are found in the following categories:

(1) Aromatic tertiary amines having the formula

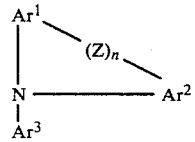

where $Ar^1$, $Ar^2$ and $Ar^3$ are aromatic having 6 to 20 carbon atoms and may be the same or different. The aromatic groups may be substituted, if desired, with groups or radicals such as hydroxyl, alkoxy, acyl or alkyl. Z may be oxygen; sulfur;

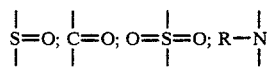

where R is aryl (of 6 to 20 carbons, such as phenyl, naphthyl, etc.); a carbon-to-carbon bond; or

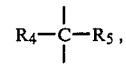

where $R_4$ and $R_5$ are selected from hydrogen, alkyl radicals of 1 to 4 carbons, and alkenyl radicals of 2 to 4 carbons, and wherein n is zero or 1.

(2) Aromatic tertiary diamines having the formula

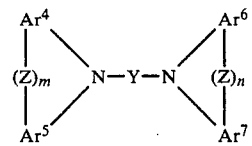

where Y is a divalent radical selected from arylene and $Ar^8$—Z—$Ar^9$, where Z is as described above for aromatic tertiary amines; $Ar^4$, $Ar^5$, $Ar^6$, $Ar^7$, $Ar^8$ and $Ar^9$ are aromatic groups having 6 to 20 carbon atoms and may be the same or different; and m and n are zero or 1. The aromatic groups may be substituted, if desired, with groups or radicals such as hydroxyl, alkoxy, acyl or alkyl.

(3) Aromatic polycyclic compounds having at least three fused benzene rings and having an ionization energy less than about 7.5 ev., as calculated by the the method of F. A. Matsen, J. Chem. Physics, 24, 602 (1956), incorporated herein by reference.

Representative sensitizers coming within the above useful classes include, e.g., triphenylamine, 2-ethyl-9,10-dimethoxyanthracene, anthracene, 9-methylanthracene, rubrene, perylene, and tetraphenylbenzidine.

The amount of aromatic iodonium or sulfonium complex salt that may be employed in the compositions of the invention is from about 0.1 to 30 parts by weight per 100 parts by weight of organic material (i.e., epoxide plus hydroxyl-containing material) and preferably from about 1 to 10 parts per 100 parts of organic material. If desired, the composition may be prepared in shelf stable concentrate form (i.e., with high levels of complex salt, e.g., 10 to 30% by weight) which is suitable for later dilution to a more commerically practical coating composition (e.g., by adding more epoxide or hydroxyl-containing material, or both, at the location where used).

Generally speaking the rate of polymerization increases with increasing amounts of complex salt at a given light exposure or irradiation. The rate of polymerization also increases with increasing light intensity or electron dosage. For those compositions wherein a sensitizer is used to make the composition sensitive to radiation of longer wavelength, about 0.01 to 1.0 part and preferably about 0.1 to 1.0 part by weight of sensitizer per part of aromatic complex salt may be employed.

The photocopolymerizable compositions of the invention are prepared by simply admixing, under "safe light" conditions, the aromatic complex salt and the sensitizer, when used, with the organic material. Suitable inert solvents may be employed if desired when effecting this mixture. Examples of suitable solvents are acetone, methylene chloride, and includes any solvent which does not react appreciably with the epoxide, the hydroxyl-containing material, the aromatic complex salt or the sensitizer. A liquid organic material to be polymerized may be used as a solvent for another liquid or solid organic material to be polymerized. An inert solvent may be used to aid in obtaining a solution of the materials and to aid in providing a suitable viscosity to the composition for purposes of coating. Solventless compositions can be prepared by simply dissolving the aromatic complex salt and sensitizer in the organic material with or without the use of mild heating.

In the following examples which will serve to illustrate the present invention, all parts are parts by weight and all percentages are given as percentages by weight, unless otherwise indicated.

EXAMPLES 1-5

To 10 parts of epoxy resin ("DER-331", epoxy equivalent weight 185) containing 0.5 parts of diphenyliodonium hexafluorophosphate and 0.05 part of 2-ethyl-9,10-dimethoxyanthracene there were added, in separate examples varying amounts of polyoxytetramethylene glycol ("Polymeg 650", hydroxyl equivalent weight 325), as shown in Table I below. The resulting solutions, which had excellent stability, were knife coated onto polyester film (75 microns) to leave a photocopolymerizable coating 100 microns thick. These samples were then each exposed to a General Electric ® H3T7 500 watt mercury vapor lamp, at a distance 7 inches (17.5 cm.). The time required for the coating of each example to cure through is also recorded in Table I. After curing, each coating could be stripped off the polyester substrate in the form of a self-supporting film.

TABLE I

| Example No. | "Polymeg 650" (Parts) | Exposure Time (Sec.) |
|---|---|---|
| 1 | 2 | 20 |
| 2 | 4 | 35 |
| 3 | 6 | 40 |
| 4 | 8 | 45 |
| 5 | 10 | 50 |

In each of Examples 1-5 the cured coatings (i.e., films) were transparent, and the flexibility of the films successively increased from Examples 1 to 5 while the film shrinkage decreased.

Weighed samples of each film were placed in jars filled with acetone and allowed to stand for 7 days with periodic shaking. The samples were then removed from the jars, dried in air for 24 hours, and then weighed again to determine weight loss. Samples of films from Examples 1, 2 and 3 showed excellent solvent resistance with very little swelling and no weight loss. Samples of films from Examples 4 and 5 lost 3.7% and 7.5% total weight, respectively. All of the hydroxyl-containing material had reacted with the epoxide in Examples 1, 2 and 3, and 91% and 85% had reacted with the epoxide in Examples 4 and 5, respectively.

Physical measurements showed that the film of Example 2 had a tensile strength of 6500 p.s.i. and 5% elongation at break while the film of Example 3 had a tensile strength of 1060 p.s.i. and 53% elongation. This demonstrates that a wide range of physical properties are obtainable from the compositions of the invention by varying the relative amounts of epoxide and hydroxyl-containing material.

EXAMPLE 6

A low viscosity (1.3 stokes), 100% solids photocopolymerizable composition was prepared using the following ingredients:

|  | Parts |
|---|---|
| Epoxy resin ("ERL-4221", equivalent weight 137) | 5 |
| Polyoxyethyleneglycol (equivalent weight 200) | 2 |
| Diphenyliodonium hexafluorophosphate | 0.25 |
| 2-ethyl-9,10-dimethoxyanthracene | 0.025 |

The ingredients were mixed with heating, and stirring, at 50° C. for 30 minutes. The resulting shelf stable composition was then coated at a thickness of 75 microns and exposed for 35 seconds to a 275 watt General Electric sunlamp at a distance of 5 inches (12.7 cm.). A transparent, self-supporting, tough film was obtained.

EXAMPLE 7

A pigmented, 100% solids, pourable photocopolymerizable shelf stable composition was prepared by ball milling the following ingredients for 6 hours:

|  | Parts |
|---|---|
| Epoxy resin ("ERL-4221") | 6 |
| Polyoxyethylene glycol (equivalent weight 200) | 3 |
| Zinc oxide | 9 |
| Diphenyliodonium hexafluorophosphate | 0.25 |
| 2-ethyl-9,10-dimethoxyanthracene | 0.025 |

A 55 microns thick film of this composition was cured to a flexible, self-supporting white film by exposure for 60 seconds to a 275 watt General Electric sunlamp at a distance of 5 inches (12.7 cm.)

EXAMPLES 8-20

In separate examples several photocopolymerizable shelf stable compositions were prepared using various epoxides, hydroxyl-containing materials, and complex salt photoinitiators. The compositions were prepared by mixing the ingredients together with mild heating. The ingredients used, and the light exposure conditions, are given in Table II below. The sunlamp was a 275 watt General Electric sunlamp used at a distance of 5 inches (12.7 cm.), and the H3T7 was a General Electric 500 watt mercury vapor lamp used at distance of 7 inches (17.5 cm.). In each example a fully cured, transparent, tough, flexible film was obtained.

TABLE II

| Example No. | Epoxide (5 parts by wt.) | Hydroxyl-containing Material | | Complex Salt | | Sensitizer | | Coating Thickness (Microns) | Exposure (Sec.) | Lamp |
|---|---|---|---|---|---|---|---|---|---|---|
| | | Type | Parts by Wt. | Type | Parts | Type | Parts | | | |
| 8 | "ERL-4221" | "PPG-400" | 3 | $\Phi_2 IPF_6$ | 0.25 | DMA* | 0.025 | 150 | 80 | Sunlamp |
| 9 | " | "PEG-1000" | 3 | " | " | " | " | 50 | 35 | " |
| 10 | "Epon 828" | "PPG-400" | 1 | " | " | " | " | 75 | 40 | H3T7 |
| 11 | "DER-331" | diethyleneglycol | 0.5 | " | " | " | " | 43 | 45 | " |
| 12 | "ERL-4221" | "PEG-400" | 2 | $\Phi_2 SCH_3 PF_6$ | " | " | " | 50 | 240 | " |
| 13 | "DER-331" | "Polymeg 1000" | 3 | $\Phi_2 IPF_6$ | " | " | " | 90 | 35 | " |

TABLE II-continued

| Example No. | Epoxide (5 parts by wt.) | Hydroxyl-containing Material Type | Parts by Wt. | Complex Salt Type | Parts | Sensitizer Type | Parts | Coating Thickness (Microns) | Exposure (Sec.) | Lamp |
|---|---|---|---|---|---|---|---|---|---|---|
| 14 | " | "Polymeg 2000" | 2 | " | " | " | " | 100 | 45 | " |
| 15 | "ERL-4221" | "PPG-400" | 3 | $\Phi_3SPF_6$ | 0.20 | None | | 50 | 90 | " |
| 16 | " | " | 3 | $\Phi_2ISbF_6$ | " | None | | 50 | 180 | " |
| 17 | "Epon 1004" | "Polymeg 650" | 1 | $\Phi_3SPF_6$ | 0.25 | DMA | 0.025 | 90 | 300 | " |
| 18 | "Epon 1010" | " | 1 | " | " | " | " | 50 | 300 | " |
| 19 | "ERL-4221" | "PEG-400" | 2 | $\Phi_2IPF_6$ | 0.025 | None | | 50 | 600 | " |
| 20 | "DER-331" | "PEP-550" | 2 | " | 0.20 | triphenylamine | 0.02 | 50 | 120 | " |

*2-ethyl-9,10-dimethoxyanthracene

EXAMPLE 21

A shelf stable photocopolymerizable composition was prepared by stirring at room temperature the following ingredients in the amounts shown:

| | Parts |
|---|---|
| Hydroxyl-containing material ("Klucel E", a 15% solution in methanol of hydroxypropylated cellulose polymer containing secondary hydroxyl groups) | 16 |
| Epoxy resin ("ERL-4221") | 1.4 |
| Diphenyliodonium hexafluorophosphate | 0.36 |
| 2-ethyl-9,10-dimethoxyanthracene | 0.11 |

The resulting composition was coated onto an anodized aluminum sheet at a wet thickness of about 60 microns using a wire-wrapped rod. The dried sample was exposed through a √2 photographic step tablet for 60 seconds to a 275 watt General Electric sunlamp at a distance of 5 inches (12.7 cm.). The exposed sample was then held under running water to dissolve away the non-photoinsolubilized areas. Seven steps of the step tablet remained on the aluminum sheet. The cured coating was ink-receptive and was useful as a lithographic printing plate.

EXAMPLE 22

A shelf stable photocopolymerizable composition was prepared by stirring together the following ingredients:

| | Parts |
|---|---|
| Hydroxyl-containing material (10% solution in methanol of "Butvar B-73") | 25 |
| n-butanol | 2 |
| Epoxy resin ("ERL-4221") | 1 |
| Diphenyliodonium hexafluorophosphate | 0.4 |
| 2-ethyl-9,10-dimethoxyanthracene | 0.12 |

The "Butvar B-73" is a commercially available polyvinylbutyral resin having a molecular weight of 50,000–80,000, a hydroxyl content of 17.5–21.0%, an acetate content of 0–2.5%, and a butyral content of 80%.

The composition was knife coated at a wet thickness of 50 microns onto a film of polyester (75 microns thick) and air dried for one hour. The sample was exposed for 15 seconds in accordance with the method of Example 21 and then dipped in methanol. Four steps of the step tablet remained after development.

EXAMPLE 23

A shelf stable photocopolymerizable composition was prepared as in Example 22 except that the "Butvar B-73" was replaced with "Butvar B-98" (a commercially available polyvinylbutyral resin having a molecular weight of 30,000–34,000, a hydroxyl content of 18–20%, an acetate content of 0–2.5%, and a butyral content of 80%). The composition was coated, dried and exposed for 20 seconds, and then developed in accordance with the procedure of Example 22. Five steps of the step tablet remained after development.

EXAMPLES 24–26

A master solution was prepared by dissolving 0.4 part of diphenyliodonium hexafluorophosphate and 0.12 part of 2-ethyl-9,10-dimethoxyanthracene into 25 parts of a 10% solution (in methanol) of "Alcohol Soluble Butyrate" (a commercially available cellulose acetate butyrate ester having on the average 47.2% butyryl, 1.6% acetyl and 4.53% hydroxyl content). In separate examples 5 parts of the master solution were mixed with various epoxides and the resulting shelf stable compositions were coated onto anodized aluminum sheets, exposed to light through a step tablet, and then developed, as in accordance with the procedures of Example 21 except that the exposed sheets were developed with methanol instead of water. The epoxides used, exposure times, and the number of steps of the step tablet remaining insoluble are given in Table III below.

TABLE III

| Example No. | Epoxide - Parts | Exposure (Sec.) | Steps Insol. |
|---|---|---|---|
| 24 | "DER-331" 0.3 | 30 | 4 |
| 25 | "ERL-4221" 0.3 | 60 | 3 |
| 26 | "DER-XD7818" 0.1 | 60 | 7 |

"DER-XD7818" is an epoxy resin of the aromatic glycidyl ether type having a viscosity of 3400 cps and an epoxide equivalent weight of 165; available from Dow Chemical Co.

EXAMPLE 27

A shelf stable photocopolymerizable composition was prepared by stirring together the following ingredients:

| | Parts |
|---|---|
| Hydroxyl-containing material (10% solution in acetone of "Butvar B-76") | 12.5 |
| n-butanol | 1 |
| Epoxy resin ("ERL-4221") | 0.4 |
| Triphenylsulfonium hexafluorophosphate | 0.2 |

| | Parts |
|---|---|
| Triphenylamine | 0.06 |

The "Butvar B-76" is a commercially available polyvinylbutyral resin having a molecular weight of 50,000–80,000, hydroxyl content of 17.5–21%, acetate content of 0–2.5%, and butyral content of 80%.

The composition was knife coated at a wet thickness of 50 microns onto a film of polyester (75 microns) and air dried for one hour. The sample was then exposed through a step tablet to the 275 watt sunlamp for two minutes using the procedure and apparatus of Example 21, after which the sample was sprayed with methanol. Three solid steps and four partial steps remained due to insolubilization of the coating.

EXAMPLES 28–43

In separate examples several shelf stable photocopolymerizable compositions were prepared in which, upon exposure to light, an epoxide copolymerizes with various types of hydroxyl-containing terminated polycaprolactones, and aliphatic polyols. These various compositions are set forth in Table IV below. In each example the ingredients were stirred together with mild heating. Upon exposure (under the conditions listed in Table II) the compositions cured to a transparent, tough, flexible film. The sunlamp was a 275 General Electric sunlamp used at a distance of 5 inches (12.7 cm.), and the H3T7 was a General Electric 500 watt mercury vapor lamp used at a distance of 7 inches (17.5 cm.).

| | Parts |
|---|---|
| Diphenyliodonium hexafluorophosphate | 0.2 |
| Triphenylamine | 0.02 |

The composition was coated at a 50 micron thickness and exposed for 5 minutes to a General Electric H3T7 500 watt mercury vapor lamp at a distance of 7 inches (17.5 cm.) and it cured to a transparent, tough, flexible film.

EXAMPLE 45

A shelf stable photocopolymerizable composition was prepared by stirring together the following ingredients:

| | Parts |
|---|---|
| Epoxy resin ("ERL-4221") | 5 |
| Hydroxyl-containing material ("PeP 550") | 1.5 |
| Diphenyliodonium hexafluorophosphate | 0.2 |
| Triphenylamine | 0.02 |

The composition was coated at a 50 micron thickness and exposed for one minute under the conditions of Example 44 and it cured to a transparent, tough, flexible film.

EXAMPLES 46–48

Shelf stable photopolymerizable compositions were prepared using the ingredients listed in Table V below:

TABLE IV

| Example No. | Epoxide (5 parts by wt.) | Hydroxyl-containing Material Type | Parts by Wt. | Complex Salt Type | Parts | Sensitizer Type | Parts | Coating Thickness (Microns) | Exposure (Sec.) | Lamp |
|---|---|---|---|---|---|---|---|---|---|---|
| 28 | "ERL-4221" | "PCP-0300" | 2 | $\phi_2SCH_3PF_6$ | 0.25 | DMA**** | 0.025 | 50 | 240 | H3T7 |
| 29 | "DEN-439" | "Paraplex U-148" | 3 | $\phi_2IPF_6$ | " | " | " | 90 | 25 | " |
| 30 | "DER-331" | "Multron R-68" | 5 | " | " | " | " | 70 | 90 | " |
| 31** | "ERL-4221" | "Multron R-14" | 2 | $\phi_3SPF_6$ | " | " | " | 38 | 120 | " |
| 32 | " | "PCP-0300" | 4 | $\phi_2IPF_6$ | " | " | " | 64 | 65 | Sunlamp (275 w) |
| 33* | " | "PCP-0210" | 3 | " | " | " | " | 50 | 60 | " |
| 34 | " | "Multron R-68" | 3 | " | " | " | " | 75 | 55 | " |
| 35*** | " | "Paraplex U-148" | 3 | " | " | " | " | 75 | 35 | " |
| 36* | " | "PCP-0230" | 2 | " | " | " | " | 64 | 90 | H3T7 |
| 37 | " | "PCP-0300" | 4 | $\phi_3SSbF_6$ | " | None | | 50 | " | " |
| 38 | " | " | " | $\phi_2IBF_4$ | " | " | | " | " | " |
| 39 | " | " | " | $(CH_3\phi)_2IPF_6$ | " | " | | " | " | " |
| 40 | " | " | " | $(CH_3\phi)_3SPF_6$ | " | " | | " | " | " |
| 41 | " | " | " | $\phi_2IAsF_6$ | " | " | | " | " | " |
| 42 | "Epon 828" | Ethoxyethanol | 2 | $\phi_3SPF_6$ | 0.20 | tetraphenyl-benzidine | 0.02 | 30 | 45 | " |
| 43 | "ERL-4221" | 1,3-Propanediol | 1 | $\phi_2IPF_6$ | " | 2-chloro-thioxanthone | " | 50 | 50 | " |

*1 part acetone added
**3 parts acetone added
***Tensile strength of 700 p.s.i.; elongation 50%
****2-ethyl-9,10-dimethoxyanthracene

EXAMPLE 44

A shelf stable photocopolymerizable composition was prepared by stirring together the following ingredients:

| | Parts |
|---|---|
| Epoxy resin ("DER-331") | 5 |
| Hydroxyl-containing material ("PeP-550") | 2 |

| Example No. | 46 | 47 | 48 |
|---|---|---|---|
| "ERL-4221" | 61.56 | 61.56 | 61.56 |
| Diglycidyl ether of Bisphenol A | 18.94 | 18.94 | 18.94 |
| Diglycidyl ether of 1,4-butanediol | 3.80 | 3.80 | 3.80 |
| Diphenyliodonium hexafluorophosphate | 1.2 | 1.2 | 1.2 |
| Tripropylene glycol | 14.2 | — | — |
| Tripropylene glycol monomethyl ether | — | 14.2 | — |

| Example No. | 46 | 47 | 48 |
|---|---|---|---|
| Gardiner Impact Test | 70 | 65 | 30 |
| Adhesion After Pasteurization | 100% | 100% | 80% |

Each of the compositions was separately coated (using a wire wrapped rod) onto panels of conventional aluminum sheeting (7.5×20 cm.×0.6 mm) used in the making of beverage cans, and then passed under two 200 watt/inch ultraviolet lamps (focused reflector), at the focal point of the lamps, and at a rate of 160 feet/minute (50 m./minute). The light reflected onto the coated panel was approximately 2.5 cm. wide. After exposure, the coatings were tack-free and fully cured within seconds at ambient temperature. The cure time can be further shortened, if desired, by slightly preheating the substrate (e.g., 50°–60° C.) prior to light exposure.

The cured films exhibit excellent heat resistance (i.e., no yellowing or other adverse effects were noted after baking at 175° C. for 9 minutes).

The toughness of the cured films was measured by a Gardiner reverse impact test (ASTM D-2794-69). The referenced test measures the maximum height (in inches) from which a steel ball can be dropped onto the reverse (i.e., uncoated) side of a cured coated panel without destroying the integrity of the cured coating. The results are reported in inch-pounds (i.e., weight of steel ball times maximum height in inches).

Adhesion of the cured coatings to the panel was evaluated by cutting a large X through the cured coating, immersing the scored panel in water at 72° C. for 20 minutes, drying the panel, firmly applying a strip of pressure-sensitive tape ("SCOTCH"-brand cellophane tape No. 610, commercially available from Minnesota Mining and Manufacturing Co.) over the X, rapidly removing the tape at a 90° angle from the panel, and estimating the fraction of the coating remaining adhered to the panel.

The coated panel samples of Examples 46 and 47 could be bent back on themselves without disrupting the integrity of the coating, whereas the integrity of the coating on the panel of Example 48 was destroyed.

EXAMPLES 49–50

Two solutions were prepared containing the following ingredients in the parts by weight shown:

| Ingredients | Example 49 | Example 50 |
|---|---|---|
| Epoxy resin "ERL-4221" | 5 | 5 |
| 1,2-propanediol | 2 | — |
| 3-chloro-1,2-propanediol | — | 2 |
| $\phi_2 I^+ PF_6^-$ | 0.2 | 0.2 |
| Anthracene | 0.02 | 0.02 |

The two solutions were each knife coated at a 2 mil (50 microns) wet film thickness on separate samples of polyester film. Each sample was exposed to an electron beam apparatus of 100 kilovolts ant 2.5 milliamps power at a distance of 0.75 inch. A 4.5 megarad dosage was sufficient to completely cure the sample of Example 50 and impart a tack-free surface cure to Example 49. A 14 megarad dosage completely cured the coating of Example 49.

What is claimed is:

1. A photocopolymerizable composition comprising:

(a) a first organic material having epoxide functionality greater than about 1.5;

(b) a second organic material having aliphatic hydroxyl functionality of at least 1; said material being free of other active hydrogens and being free of epoxide groups; and (c) a complex salt photoinitiator selected from the group consisting of:

(i) aromatic iodonium complex salts having the formula

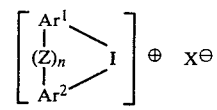

where $Ar^1$ and $Ar^2$ are aromatic groups having 4 to 20 carbon atoms and are selected from the group consisting of phenyl, thienyl, furanyl and pyrazolyl groups; Z is selected from the group consisting of oxygen; sulfur;

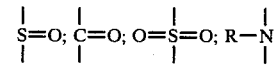

where R is aryl or acyl; a carbon-to-carbon bond; or

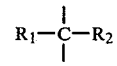

where $R_1$ and $R_2$ are selected from hydrogen, alkyl radicals of 1 to 4 carbons, and alkenyl radicals of 2 to 4 carbons; and n is zero or 1; and wherein $X^-$ is a halogen-containing complex anion selected from tetrafluoroborate, hexafluorophosphate, hexafluoroarsenate, and hexafluoroantimonate; and (ii) aromatic sulfonium complex salt having the formula

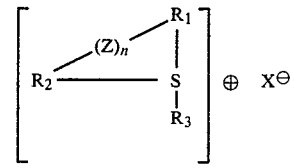

wherein $R_1$, $R_2$ and $R_3$ are selected from the group consisting of aromatic groups having 4 to 20 carbon atoms and alkyl radicals having 1 to 20 carbon atoms; wherein at least one of $R_1$, $R_2$ and $R_3$ is aromatic; wherein Z is selected from the group consisting of oxygen; sulfur;

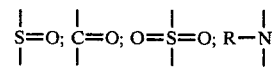

where R is aryl or acyl; a carbon-to-carbon bond; or

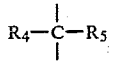

where $R_4$ and $R_5$ are selected from the group consisting of hydrogen, an alkyl radical having 1 to 4 carbon atoms, and an alkenyl radical having 2 to 4 carbon atoms; and n is zero or 1; and X is a halogen-containing complex anion selected from tetrafluoroborate, hexafluorophosphate, hexafluoroarsenate, and hexafluoroantimonate;

wherein the ratio of hydroxyl equivalents in said second organic material to epoxide equivalents in said first organic material is in the range of 0.001/1 to 10/1; and wherein said photoinitiator is present in said composition in an amount of about 0.1 to 30 parts by weight per 100 parts by weight of combined first and second organic materials.

2. A photocopolymerizable composition in accordance with claim 1, wherein said first organic material is selected from the group consisting of cycloaliphatic epoxides, glycidyl esters, glycidyl ethers, epoxy novolaks, aliphatic epoxides, polymers and copolymers of acrylic acid esters of glycidol and copolymerizable vinyl compounds, and epoxidized polyalkadienes.

3. A photocopolymerizable composition comprising:
   (a) a first organic material having epoxide functionality greater than about 1.5;
   (b) a second organic material having aliphatic hydroxyl functionality of at least 2; said material being free of other active hydrogens and being free of epoxide groups; wherein said second organic material comprises polyoxyalkylene polyol having a molecular weight of at least 200; and
   (c) a complex salt photoinitiator selected from the group consisting of:
      (i) aromatic iodonium complex salts having the formula

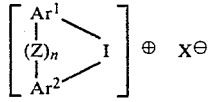

where $Ar^1$ and $Ar^2$ are aromatic groups having 4 to 20 carbon atoms and are selected from the group consisting of phenyl, thienyl, furanyl and pyrazolyl groups; Z is selected from the group consisting of oxygen; sulfur;

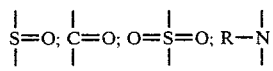

where R is aryl or acyl; a carbon-to-carbon bond; or

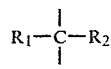

where $R_1$ and $R_2$ are selected from hydrogen, alkyl radicals of 1 to 4 carbons, and alkenyl radicals of 2 to 4 carbons; and n is zero or 1; and wherein $X^-$ is a halogen-containing complex anion selected from tetrafluoroborate, hexafluorophosphate, hexafluoroarsenate, and hexafluoroantimonate; and (ii) aromatic sulfonium complex salt having the formula

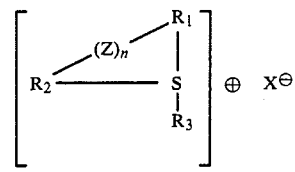

wherein $R_1$, $R_2$ and $R_3$ are selected from the group consisting of aromatic groups having 4 to 20 carbon atoms and alkyl radicals having 1 to 20 carbon atoms; wherein at least one of $R_1$, $R_2$ and $R_3$ is aromatic; wherein Z is selected from the group consisting of oxygen; sulfur;

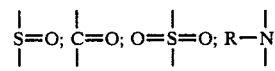

where R is aryl or acyl; a carbon-to-carbon bond; or

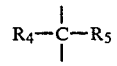

where $R_4$ and $R_5$ are selected from the group consisting of hydrogen, an alkyl radical having 1 to 4 carbon atoms, and an alkenyl radical having 2 to 4 carbon atoms; and n is zero or 1; and $X^-$ is a halogen-containing complex anion selected from tetrafluoroborate, hexafluorophosphate, hexafluoroarsenate, and hexafluoroantimonate. wherein the ratio of hydroxyl equivalents in said second organic material to epoxide equivalents in said first organic material is in the range of 0.001/1 to 10/1; and wherein said photoinitiator is present in said composition in an amount of about 0.1 to 30 parts by weight per 100 parts by weight of combined first and second organic materials.

4. A photocopolymerizable composition in accordance with claim 3, wherein said first organic material is selected from the group consisting of cycloaliphatic epoxides, glycidyl esters, glycidyl ethers, epoxy novolaks, aliphatic epoxides, polymers and copolymers of acrylic acid esters of glycidol and copolymerizable vinyl compounds, and epoxidized polyalkadienes.

5. A photocopolymerizable composition in accordance with claim 3, wherein said photoinitiator is an aromatic iodonium complex salt and wherein said $Ar^1$ and $Ar^2$ are selected from phenyl and substituted phenyl groups.

6. A photocopolymerizable composition in accordance with claim 5, wherein n is zero.

7. A photocopolymerizable composition in accordance with claim 5, wherein n is 1 and Z is a carbon-to-carbon bond.

8. A photocopolymerizable composition in accordance with claim 1, wherein said photoinitiator is an aromatic iodonium complex salt and wherein said $Ar^1$ and $Ar^2$ are selected from thienyl and substituted thienyl groups.

9. A photocopolymerizable in accordance with claim 8, wherein n is zero.

10. A photocopolymerizable composition in accordance with claim 3, wherein said second organic material is selected from the group consisting of alkylene glycols, hydroxy-terminated polyesters, hydroxy-terminated polyethers, cellulose esters, cellulose ethers, polyoxyalkylene glycols, and copolymers of vinyl compounds with hydroxy-substituted acrylate esters.

11. A photocopolymerizable composition in accordance with claim 3, wherein said photoinitiator is an aromatic sulfonium complex salt.

12. A photocopolymerizable composition in accordance with claim 11, wherein said $R_1$, $R_2$ and $R_3$ are each selected from the group consisting of substituted and unsubstituted phenyl, naphthyl and thienyl groups.

13. A photocopolymerizable composition in accordance with claim 11, wherein n is 1, and Z is a carbon-to-carbon bond.

14. A photocopolymerizable composition in accordance with claim 11, wherein n is zero; $R_1$ is alkyl; and $R_2$ and $R_3$ are selected from the group consisting of substituted and unsubstituted phenyl, naphthyl and thienyl groups.

15. A photocopolymerizable composition in accordance with claim 11, wherein n is 1 and Z is an oxygen atom, and wherein $R_1$ is alkyl and $R_2$ and $R_3$ are phenyl groups.

16. A photocopolymerizable composition in accordance with claim 3, wherein said composition further contains about 0.01 to 1 part by weight of sensitizing dye per part by weight of photoinitiator.

17. A photocopolymerizable composition in accordance with claim 3, wherein said photoinitiator is selected from diaryliodonium hexafluorophosphate, diaryliodonium hexafluoroantimonate, triarylsulfonium tetrafluoroborate, triarylsulfonium hexafluorophosphate, and triarylsulfonium hexafluoroantimonate.

18. A dilutable photocopolymerizable composition in accordance with claim 3, wherein said photoinitiator is present in an amount of about 10 to 30% by weight.

* * * * *